United States Patent [19]

Gordecki

[11] Patent Number: 4,880,712
[45] Date of Patent: Nov. 14, 1989

[54] BATTERY HOUSING

[75] Inventor: Richard J. Gordecki, Ocean Ridge, Fla.

[73] Assignee: Motorola, Inc., Schaumburg, Ill.

[21] Appl. No.: 320,434

[22] Filed: Mar. 8, 1988

[51] Int. Cl.⁴ ............................................. H01M 2/10
[52] U.S. Cl. ...................................... 429/97; 429/100; 206/333; 220/346
[58] Field of Search ................................ 429/96-100; 206/333; 220/346

[56] References Cited

U.S. PATENT DOCUMENTS

| | | | |
|---|---|---|---|
| 3,887,394 | 6/1975 | Kaye | 429/99 |
| 3,942,630 | 3/1976 | Phillips | 220/346 X |
| 3,960,270 | 6/1976 | May | 220/346 |
| 4,493,880 | 1/1985 | Lund | 429/97 |
| 4,584,250 | 4/1986 | Hooke et al. | 429/97 |
| 4,723,656 | 2/1988 | Kiernan et al. | 429/100 X |

Primary Examiner—Anthony Skapars
Attorney, Agent, or Firm—Vincent B. Ingrassia; Anthony J. Sarli, Jr.

[57] ABSTRACT

A battery housing (4) for a radio pager (1) comprises a slidable cover (5) movable between a first position, where it closes off an opening (3) for insertion and removal of a battery, and a second position where it leaves the opening accessible. The cover (5) is only allowed to move from its closed position when a slidable locking member (8) is moved to its unlocked position. Movement of the cover (5) from its closed position to its open position automatically causes the locking member (8) to be moved back to its locked position so that when the cover (5) is closed again it is automatically locked in the closed position.

8 Claims, 3 Drawing Sheets

BATTERY HOUSING

This invention relates generally to battery housings for battery-powered electrical products, and more particularly for electrical products which require changes of battery relatively frequently such as various types of portable consumer electrical products. Such portable electrical products may include for example portable radio receivers such as those commonly known as pagers.

Battery-powered electrical products generally include a housing into which the battery is inserted, the housing having therein electrical contacts for contacting the battery and coupling it to electrical circuits within the product. Such battery housings have an opening through which the battery is inserted into the housing and a cover for covering the opening so that the battery is not accidentally dislodged and lost from the housing. It will be appreciated that although reference is being mad to a single battery, the same is true of products that require more than one battery and references to a battery herein are to be taken as including several batteries.

In commonly available portable, consumer products, the housing cover is frequently simply latched in place so that to open it, it is necessary to lever the cover up until it unlatches, at which time it separates from the housing and may easily be lost. Alternately, covers are known which are hinged to the housing by means of an integral plastic hinge. This avoids the possibility of losing the cover but such hinges are very weak and easily broken. It is therefore an object of the present invention to provide a battery housing having an improved cover which is less likely to be lost or broken when being opened for the purpose of changing a battery. It is a further object of the invention to provide a battery housing having a lockable cover which reduces the possibility of accidental opening and consequent loss of the battery.

Accordingly, the present invention provides a battery housing for a battery-powered electrical product having an opening for inserting and removing the battery into and from the housing, wherein the housing comprises a cover slidably movable between a first position where it closes off the opening and a second position where it leaves the opening accessible, and locking means slidably movable transversely to the cover movement between a first position where it locks the cover in its first position and a second position where it allows the cover to move to its second position.

In a preferred embodiment of the invention there is further provided means associated with the cover and the locking means for moving the locking means from its second position to its first position when the cover is moved between its first and second positions.

A battery housing for a radio pager will now be more fully described by way of example with reference to the drawings of which:

Figure 1:
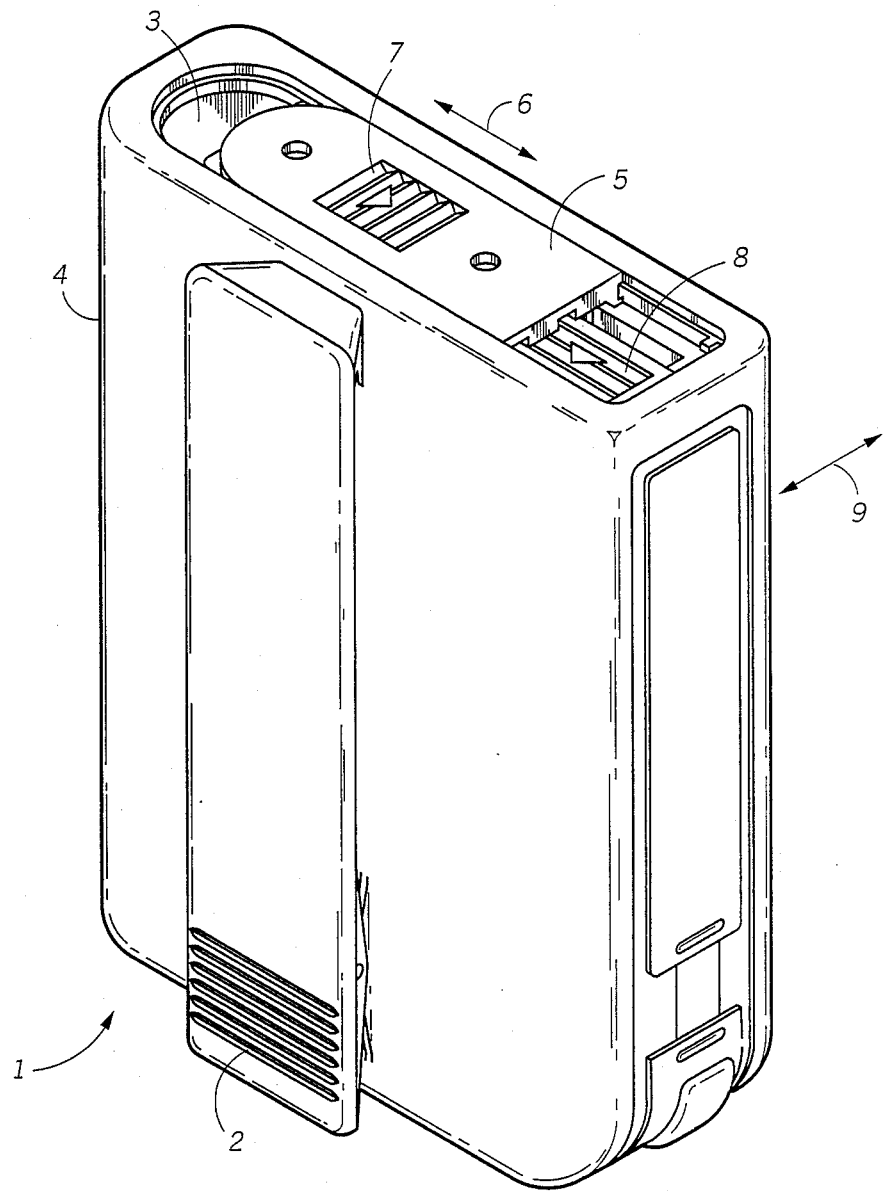
FIG. 1 is a perspective bottom view of a radio pager incorporating the invention.

Thus, there is shown in FIG. 1 a radio pager 1 of the type which can be clipped, for example, to a person's shirt pocket via a clip 2. The drawing shows the bottom surface of the pager 1 having an opening 3 for insertion of a battery (not shown) into the pager to provide electrical power. As is well known in the art, the pager will include various controls and devices to alert the user of the pager that a message is waiting. Such controls and devices are not shown in the Figure.

According to the invention the pager 1 includes a housing 4 for the battery, the housing including a cover 5 for closing off the opening 3 when access to the battery housing is not required. The cover 5 is captured within the housing and is constrained to slide in the directions shown by arrow 6 between a first (closed) position where it closes off the opening 3 and a second (open) position where it leaves the opening 3 accessible for insertion and removal of the battery (the drawing shows the cover midway between its first and second positions). The cover includes a corrugated thumb zone 7 to reduce slippage between a thumb or finger when it is desired to slide the cover 5. Cover 5, when moved to its open position, slides over a locking member 8 which is itself slidable in a direction shown by arrow 9 which is transverse to the direction of movement of cover 5 as shown by arrow 6. As will be explained below, this locking member 8 is slidable between a first (locked) position, where it prevents the cover 5 from being opened, and a second (unlocked) position, where it allows the cover 5 to be opened. The drawing shows the locking member 8 in its locked position. The locking member also has a corrugated thumb zone 9 to allow it to be moved more easily by a thumb or finger of the user.

Figure 2:
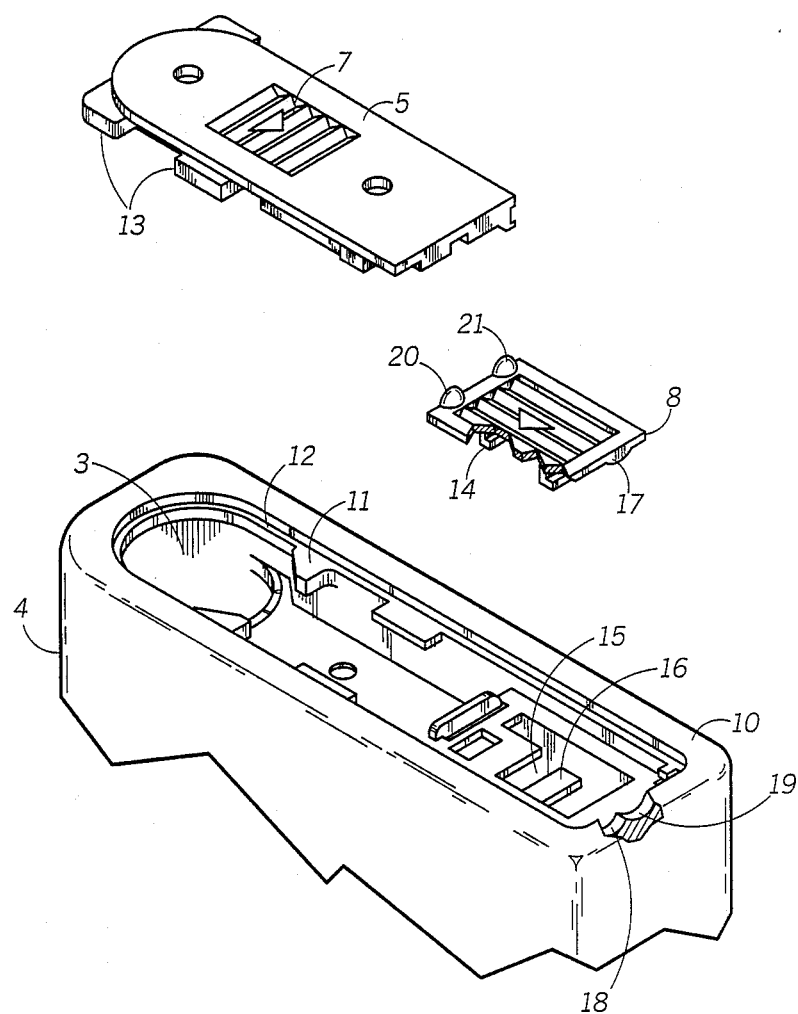
FIG. 2 is an exploded view of the bottom portion of the pager of FIG. 1.

The housing 4, the cover 5 and the locking member 8 are more clearly shown in FIG. 2. As clearly shown in this figure, the housing 4 has a rim 10 and rails 11 jointly forming grooves 12 in the two sides of the housing. The cover 5 is provided with tongues 13 in its side which fit into the groove 12 and thereby constrain the cover 5 to slide only along the grooves. In this way the cover is fully captured at all times by the housing and is only allowed to move between one end of the housing, where the opening 3 is situated, and a second end of the housing which includes the locking member 8. This locking member 8 is constrained to slide within the housing, transversely to the movement of the cover 5, by means of right-angled tongues 14, provided on the lower face of the member 8, which travel within slots 15 formed in a flat member 16 provided in the housing 4. The locking member 8 is also provided with a projection 17 on a side edge thereof. This projection 17 travels over ramps 18, 19 formed at the side of the member 16 as the locking member 8 is slid between its locked and unlocked positions. The natural resilience of the locking member 8 allows the projection 17 to travel up the ramps 18, 19, both of which have upper portions at the center of the member 16 and are continuous so as to form an inverted V-shaped cam. Thus, the projection moving over this cam causes the locking member to be biased to either its locked or unlocked positions and the locking member is therefore bistable between these two positions.

Figure 3:
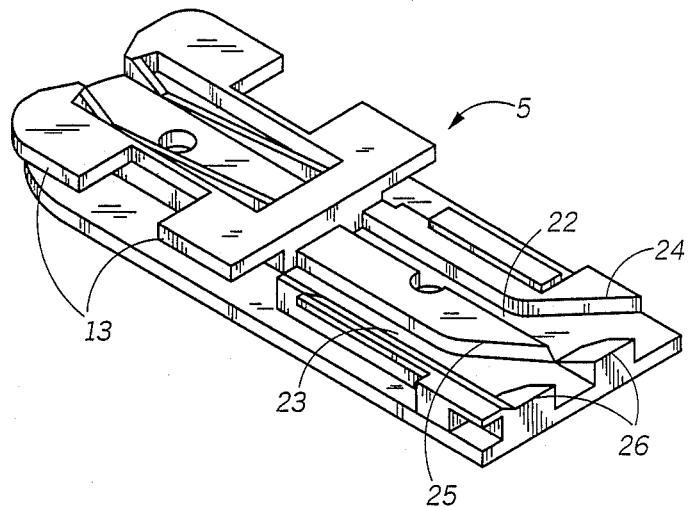
FIG. 3 shows the under surface of the battery housing cover shown in FIG. 2.

The locking member 8 is further provided with two spigots 20, 21 upstanding from its upper surface at an edge thereof opposite to the projection 17. When the cover 5 is closed and the locking member 8 is in its locked position, these spigots 20, 21 abut against the edge of the cover 5 preventing it from being moved. However, when the locking member 8 is moved to its unlocked position, these spigots 20, 21 are then adjacent channels 22, 23 formed in the lower face of the cover 5. These channels are more clearly shown in FIG. 3 which shows the lower face of the cover 5. Each of the channels 22, 23 is formed with first and second portions parallel to the direction of motion of the cover 5 but laterally displaced from each other, and a third diagonal portion joining the first and second portions. The third portion of each channel thus provide a respective cam surface 24, 25 which will bias the respective spigot 20, 21 from the first portion of the channel to the second portion of the channel as the cover is moved.

As described above, when the locking member is in its unlocked position, the spigots 20, 21 are adjacent the open ends of the respective channels 22, 23 thereby allowing the cover to be moved from its closed position. Such movement of the cover causes it to move over the locking member and the spigots are then constrained within their respective channels. As the cover is first moved from its closed position, the spigots enter the first portions of their respective channels. Further movement of the cover to its open position causes the spigots to bear against the cam surfaces 24, 25 and still further movement of the cover forces the spigots to follow the diagonal portion of the channel thereby forcing the locking member 8 to move to its locked position. The locking member 8, being bistable, is biased to its locked position and remains there as the cover is moved fully to its open position.

When the cover is then moved back from its open position towards its closed position, the spigots 20, 21 remain within the channels 22, 23 respectively throughout the straight, second portion of the channels. However the channels do not include a cam surface in this direction of motion to force the locking member to move to its unlocked position. Instead the locking member remains in the locked position as the cover is moved towards its closed position. The cover is finally locked in its closed position by virtue of a ramp 26 provided in each of the channels in line with the second portion of the channel. As the cover is moved to its closed position, the ramp moves over the respective spigot allowing the natural resilience of the cover to bias it up and over the spigot. When the spigot reaches the end of the ramp, the cover drops back behind the spigots which thereby abut the edge of the cover forming the end of the ramps and thus lock the cover in its closed position.

There has thus been described a battery housing having a lockable, fully captive cover which is less likely to be accidentally opened or lost than previously known covers.

I claim:

1. A battery housing for a battery-powered electrical product having an opening for inserting and removing the battery into and from the housing, wherein the housing comprises a cover slidably movable between a first position where it closes off the opening and a second position where it leaves the opening accessible, and locking means slidably movable transversely to the cover movement between a first position where it locks the cover in its first position and a second position where it allows the cover to move to its second position.

2. A battery housing according to claim 1 wherein said locking means comprises a member having at least one spigot thereon which abuts an edge of the cover when the member and cover are in their respective first positions thereby preventing the cover from moving to its second position.

3. A battery housing according to claim 1 further comprising means associated with the cover and the locking means for moving the locking means from its second position to its first position when the cover is moved between its first and second positions.

4. A battery housing according to claim 3 wherein said means associated with the cover and the locking means comprises at least one channel provided in a surface of the cover and at least one spigot attached to the locking means and cooperating with the channel, whereby movement of the channel causes the spigot to follow cam surfaces defined by the channel such that the locking means is moved from its second position to its first position.

5. A battery housing according to claim 1 wherein said locking means is bistable between its first and second positions.

6. A battery housing according to claim 1 wherein said cover is wholly captive within said housing between its first and second positions.

7. A battery housing according to claim 4 wherein said channel further defines a ramp surface over which the spigot travels as the cover is moved to its first position, the end of the ramp providing an edge of the cover against which the spigot abuts to lock the cover in its first position.

8. A battery housing according to claim 1 for a radio pager.

* * * * *

UNITED STATES PATENT AND TRADEMARK OFFICE
CERTIFICATE OF CORRECTION

PATENT NO.   : 4,880,712
DATED        : November 14, 1989
INVENTOR(S)  : Richard J. Gordecki It is certified that error appears in the above-indentified patent and that said Letters Patent is hereby corrected as shown below:

Please change the filing date from "March 8, 1988" to --March 8, 1989--.

Signed and Sealed this

Twenty-ninth Day of March, 1994

Attest:

BRUCE LEHMAN

Attesting Officer

Commissioner of Patents and Trademarks